United States Patent [19]

Rybka

[11] Patent Number: 5,096,880
[45] Date of Patent: Mar. 17, 1992

[54] METHOD AND APPARATUS FOR INDUCING GRAIN ORIENTATION BY MAGNETIC AND ELECTRIC FIELD ORDERING DURING BULK SUPERCONDUCTOR SYNTHESIS

[75] Inventor: Theodore W. Rybka, El Cajon, Calif.
[73] Assignee: General Dynamics Corp./Electronics Division, San Diego, Calif.
[21] Appl. No.: 512,220
[22] Filed: Apr. 20, 1990

Related U.S. Application Data

[62] Division of Ser. No. 260,295, Oct. 20, 1988, Pat. No. 4,939,121.
[51] Int. Cl.$^5$ .................................. H01B 12/00
[52] U.S. Cl. ........................ 505/1; 505/727; 505/731; 505/732; 505/815; 204/155; 419/1
[58] Field of Search ............... 419/1; 204/155; 505/1, 505/727, 731, 732, 815

[56] References Cited

U.S. PATENT DOCUMENTS 4,942,151  7/1990  Capone et al. .................... 505/1

FOREIGN PATENT DOCUMENTS 09312  12/1988  World Int. Prop. O. .

OTHER PUBLICATIONS

Heald, S. M. et al., "Orientation Dependent X-Ray Absorption Near Edge Structure in $YBa_2Cu_3O_7$ and $La_{1.85}Sr_{0.15}CuO_4$", Mat. Res. Soc. Symp. Proc. vol. 99, pp. 757-760.
Ekin, J. W., "Transport Critical Current in Bulk Sintered $Y_1Ba_2Cu_3O_x$ and Possibilities for Its Enhancement", Advan. Cer. Mat., vol. 2, No. 3B (1987) pp. 586-592.
Solin, S. A. et al, "Field-Induced Orientation of Non-levitated Microcrystals of Superconducting $YBa_2Cu_3O_{7-x}$", Phys. Review Letters, vol. 60, No. 8 (1988), pp. 744-747.
Cava et al., Phys. Rev. Ltrs., 58, 16, 1676-1679 (Apr. 10, 1987).
Anon., High $T_c$ Update, 1, 16 (Dec. 15, 1987).
Anon., Sci. Amer., 257, 4, 32 and 34 (Oct. 1987).
Hazen, Sci. Amer., 258, 6, 74-81 (Jun. 1988).
Thompson et al., Phys. Rev. B, 36, 1 836-839 (Jul. 1987).
Chen et al., Rev. Sci. Instrum. 58, 9 1565-1571 (Sep. 1987).
Haldar et al., Science, 241, 1190-1200 (1988).
Tarascon et al., Phys. Rev. B., 36, 1 (1987).
Anon., Adv. Matls. & Procs./Metal Prog., p. 76, (8/87).
Schwartz, Adv. Cer. Matls., 2, 4, 753 (1987).
Sun et al., Phys. Rev. Ltrs., 58, 15, 1574-1576 (Apr. 13, 1987).
Chin et al., abstract presented at Amer. Cer. Meeting, San Diego, (11/02/87).
Ginley et al., Phys. Rev. B, 36, 1, 829-832 (Jul. 1, 1987).
Superconductor Week, vol. 2, No. 1 (Jan. 4, 1988); vol. 2, No. 2 (Jan. 11, 1988).

Primary Examiner—John Niebling
Assistant Examiner—Steven Marquis
Attorney, Agent, or Firm—Brown, Martin, Haller & McClain

[57] ABSTRACT

A process is described for enhancing superconductor characteristics by application of strong magnetic and/or electric fields to the constituent component materials from which ceramic superconductors are being formed and during the time that these superconductors are being synthesized. This process has particular applicability to the production of superconducting oxide ceramics such as the cuprates. The required magnetic fields are on the order of 1-10 tesla and the required electric fields are on the order of 0.1-1 MV/cm. The fields act as ordering mechanisms and induce grain orientation. The magnetic field aligns the magnetic moment of the grains. The electric field induces electric polarization in the grains and then aligns them. The superconducting structure formation occurs during the sintering, cooling and annealing phases of the fabrication process. Superconductivity is strongly affected by the oxygen stoichiometry in the lattice elemental cell. Applied electric fields cause elongation of the unit cell. This accelerates oxygen diffusion throughout the lattice and this gives better control of the oxygen content of the sample. Applied magnetic fields exert a magnetic pressure on the sample. This invention produces ceramic superconducting materials with a high degree of grain orientation and current density properties equivalent to or exceeding many of the existing superconducting materials.

17 Claims, 2 Drawing Sheets

METHOD AND APPARATUS FOR INDUCING GRAIN ORIENTATION BY MAGNETIC AND ELECTRIC FIELD ORDERING DURING BULK SUPERCONDUCTOR SYNTHESIS

This is a divisional of application Ser. No. 07/260,295 filed Oct. 20, 1988 U.S. Pat. No. 4,939,121 filed on 7-3-90.

FIELD OF THE INVENTION

The invention herein relates to superconducting materials. More particularly it relates to methods of producing superconducting materials.

BACKGROUND OF THE INVENTION

Over the last year or two remarkable strides have been made in the field of superconducting materials. Previously it was thought that to be superconducting, materials (which predominantly were metallic) had to be kept at temperatures on the order of 15°-20° K. or lower. However, a series of recent discoveries in the field of ceramics has led to the appearance of a variety of materials which are superconducting at temperatures of 100° K. or greater. These, of course, offer great potential since their superconducting properties can be utilized at temperature conditions which are easily and routinely maintained with liquid nitrogen cryogenic equipment, rather than being limited to use only in the exacting and difficult to obtain liquid helium temperature ranges near absolute zero.

A key property of superconductivity is the ability to maintain a high current density in the superconducting material. The particular current density involved will be dependent upon whether the superconducting material is in the form of single crystals and thin films or in bulk and polycrystalline form; Cava et al., *Phys. Rev. Ltrs.*, 58, 16, 1676 (1987). It has been stated that current density can be increased by ordering the grains in bulk superconducting ceramics; Anon., *Superconductor Week.* 1, 3, 2, (Jan. 4, 1988). Grain ordering has been accomplished to some degree by melting the superconducting material and then cooling it to achieve a more aligned grain orientation; Jin et al., reported in *High $T_c$ Update*, 1, 16, 1 (Dec. 15, 1987). Another approach taken by researchers has been to apply a magnetic field to a bulk superconducting ceramic after the material has been completely formed; Finnemore, reported in *Sci. Amer.*, 257, 4, 32 (Oct. 1987). Neither of these techniques has been particularly successful, and current densities high enough for commercial applications have not been achieved to date. In addition, melting of the material's crystalline structure imparts significant changes which can adversely affect not only superconductivity but also other properties of the material. Further, the post-formation magnetic field application achieves only a very limited success since the grain orientations are essentially fixed upon cooling and are only reoriented incompletely and with considerable difficulty.

Many of the new ceramic materials are classified as cuprates. A number of articles describing the formulas, structures, properties and preparation of cuprates have recently appeared: notable among these are Hazen, *Sci. Amer.*, 258, 6, 74 (June 1988); Thompson et al, *Phys. Rev. B*, 36, 1, 836 (1987); Chen et al., *Rev. Sci. Instrum.*, 58, 9, 1565 (Sept. 1987) and Haldar et al., *Science*, 241, 1198 (Sept. 2, 1988).

Various studies have shown that the superconductivity of the metal cuprates is a function of the oxygen content of the repeating crystalline unit; Hazen, supra; Tarascon et al., *Phys. Rev. B*, 36, 1, 226 (1987). It has been found that the superconductivity is dependent upon elemental oxygen vacancies in the unit lattice, with both the number of vacancies and their locations being significant; Anon., *Metal Progress.* p. 76 (Aug. 1987) and Schwartz, *Adv. Cer. Matls.*, 2, 4, 753 (1987). Thus much of the reported research has been directed toward controlling the oxygen content of the superconducting cuprates.

SUMMARY OF THE INVENTION

The invention herein is a process for the formation or enhancement of superconducting properties in a superconductivity-susceptible material which comprises reacting the reactants which produce said material in a formation zone at a temperature of at least the sintering temperature of the reactants to form said material and imposing across said formation zone during said formation of material a magnetic or electric field of sufficient strength to form or enhance superconducting properties in said material. The resulting product is a superconducting material with a high degree of grain orientation and alignment of the magnetic moments or electric dipoles of the grains, exhibiting current density properties equivalent to or exceeding many of the existing superconducting materials.

Magnetic fields are on the order of 1-10 tesla and electric fields are on the order of 0.1-1 MV/cm.

Preferably the material when formed will be a crystalline material, particularly a ceramic and especially an oxide ceramic. (For the purposes herein, it will be understood that "crystalline" can mean both individual single crystals and the normal, bulk compositions which are aggregates of individual crystals or "polycrystalline" and which can includes regions which are not completely crystalline. The particular context of the description will make clear to the person skilled in the art the specific interpretation of the term "crystalline" at that point.) Application of the electric and/or magnetic fields imposes a full or partial ordering (alignment) or orienting of the magnetic and/or electric moments, respectively, of the crystalline grains or domains. Of particular interest are those compositions in which the superconducting properties are dependent on the presence of an elemental deficiency in the crystalline unit lattice. In this case the process includes simultaneous incorporation of the deficient element under controlled conditions.

The preferred crystalline materials the cuprates, especially the "1-2-3" perovskites or the "thallium/bismuth" cuprates, but the invention is applicable to all material structures, especially crystalline structures, to which superconductivity can be imparted by imposition of a strong magnetic or electric field during formation of the composition, including those in which superconductivity is dependent on existence of a controlled amount of elemental vacancies in the crystalline unit lattice.

BRIEF DESCRIPTION OF THE DRAWINGS

FIG. 2A shows the material before the electric field is applied and FIG. 2B shows the effect of the application of an electric field to the material.

DETAILED DESCRIPTION AND PREFERRED EMBODIMENTS

Figure 1A:
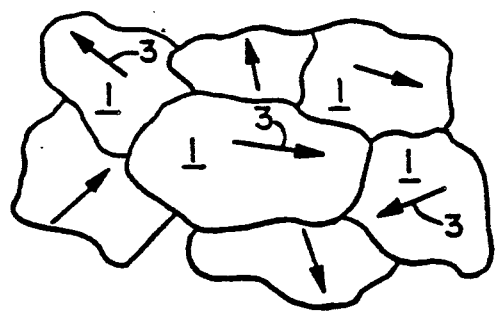
FIGS. 1A and 1B are schematic diagrams showing the orientation of the magnetic moments of the grains or domains in a material before (FIG. 1A) and after (FIG. 1B) the application of a magnetic field to the material.

The invention herein involves the discovery that application of a strong magnetic or electric field to the reaction zone during formation of a composition, especially one with a crystalline structure, from its reactants in that reaction zone, can impart superconductivity properties to the composition. As will be discussed below, the process causes the orientation of the magnetic moments, and, in the case of application of an electric field, formation and orientation of the electric dipole moments, in the individual grains or domains of the material, which results in the material acquiring a superconducting nature. The invention is especially applicable to the oxide ceramic materials, such as the cuprates. Where the superconducting properties of the composition are dependent on the presence of elemental deficiencies in the crystalline lattice, as with the some cuprates, the process promotes diffusion of the deficient element (e.g., oxygen) in the unit cell structure during formation of the superconducting product.

The present process allows one to obtain high current densities in the superconducting material, produce a single phase material with a sharp transition temperature and simplify superconductor processing. A most important effect is improvement in the current density of the superconducting material. For instance, in the past polycrystalline and bulk superconductors have been reported with current density values on the order of $10^2$–$10^4$ A/cm$^3$ and some single crystal and thin film structures have been reported with current densities of $10^5$–$10^6$ A/cm$^3$. The process of this invention can substantially increase those values, in some cases by two orders of magnitude. The process also has the potential of improving the transition temperature of the material. It also simplifies formation of a single phase material by reducing the number of cycles of magnetic field or electrical field application needed to obtain grain orientation and addition of oxygen content. It is also anticipated that grain formation will be promoted and that the microstructure of the material will be improved, with suppression of the formation of non-superconducting regions in the ceramic.

It will be understood that the process herein is applicable generally to those compositions which are capable of acquiring superconducting properties. It will also be understood that a definitive list of such materials cannot be set forth, since the field is advancing so rapidly that many new suitable materials are appearing. The invention herein, therefore, is believed to be applicable not only to the materials presently known but also to those which may be developed in the future and which have substantially the same ability to have superconductivity properties imparted (produced or enhanced) by this invention as do the currently known materials.

The invention can be best understood by a discussion of the effects of the imposition of the fields across the material during its formation. While it is believed that the mechanisms here discussed are the correct explanation of the theory of the invention, the invention is not to be considered limited thereby, but rather is to be considered to be defined solely by the physical operations described.

If, during formation of a ceramic material from its powdered reactants, magnetic and electric fields are applied (preferably simultaneously) across the reactants, a number of resulting configurations of field vectors can be possible. The magnetic and electric vectors can be parallel, anti-parallel, perpendicular or at an angle of other than 0°, 90° or 180°. Since the magnetic field exerts a magnetic pressure on the material and the electric field produces a stress in the material, the resultant properties of the material are found to be substantially different from what the properties would be in the absence of the imposition of the fields.

The ceramics of interest in this invention are found to be paramagnetic in the normal state and diamagnetic in the superconducting state. Paramagnetism is due to the electron spin of the ions in the cell structure. As the ceramic is forming in solid solution the imposition of the magnetic field will align the spins on the grain level and preferentially promote microcrystallite growth. The magnetic moments of the grains (i.e., the unit cell structure) can be increased significantly (perhaps by an order of magnitude) by incorporating magnetic atoms (such as rare earth element atoms) into the unit cells.

Figure 1B:
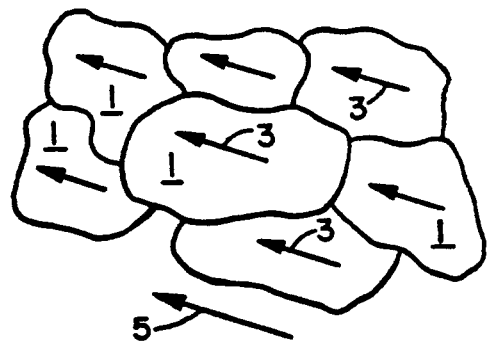

Grain moment ordering is illustrated schematically in FIGS. 1A and 1B. FIG. 1A illustrates the random magnetic moment orientation which exists in a crystalline material such as a ceramic when the material is formed in the absence of any imposed magnetic field. Each bipolar magnetic moment 3 which forms in its individual crystal grain or domain 1 has its own directional orientation, which is determined by the environmental magnetic fields which happen to affect that grain at the moment of its crystallization. Since the grains do not all form simultaneously and the small ambient fields vary constantly, the directions of the moments also vary. With such random distribution, the ability of the material to exhibit superconductivity is severely limited. In the situation shown in FIG. 1B, however, the grains at the time of their formation are subject to a continually imposed unidirectional magnetic field 5, which is much greater in strength than the normal ambient forces. The imposed magnetic field is therefore the dominant force to which the grain moments 3 respond. In this case it does not matter that the grains 1 form at different times, for the imposed force 5 remains constant throughout the entire reaction period in which the crystalline material forms and consolidates. It also remains through the annealing and cooling period which terminates the formation period, so that the magnetic moments are fixed in direction.

A strong electric field applied during ceramic formation will induce electric dipole moments in the material as the domains are forming, and these induced dipole moments will be predominantly oriented in the direction of the electric field. After sintering is complete the material is cooled while maintaining the applied external electric field, so that the product material will contain the highly oriented domains.

Figure 2A:
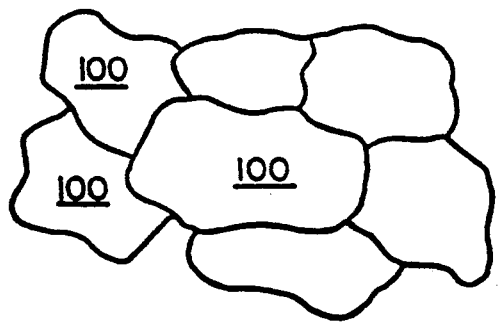
FIGS. 2A and 2B are schematic diagrams showing the inducement and orientation of the electric dipole moments of the grains or domains in a material.
Figure 2B:
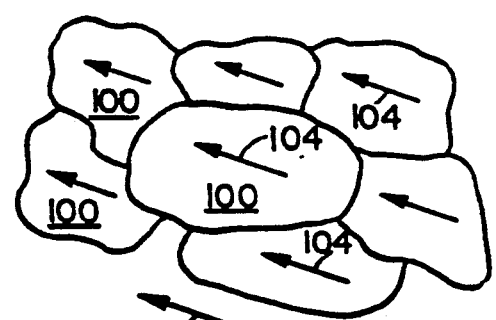

FIGS. 2A and 2B illustrate the effect of the imposition of the external electric field. Before application of the field (FIG. 2A), the domains 100 in the reactants have no electric dipole moments and the domains are not oriented or polarized. After imposition of the field in the direction indicated by the arrow 102 during formation of the material the microstructure and unit cell structure of the material are changed, in that dipole moments are induced in the domains of the product and those domains are polarized with the dipole moments oriented in the direction shown by the arrows 104.

While the process is exemplified herein by description of a thermal procedure involving sintering, annealing and cooling (along with the preliminary mixing and pressing of the reactant powders), the process is also applicable to "wet" procedures such as the "oxalate process" and the "solgel process."

The magnitudes of the magnetic and electric fields required can be determined from known formulas. Considering first the magnetic field, magnetic energy density $w_m$ is found from Equation 1.

$$w_m = \frac{B^2}{2\mu_0\mu_r} \quad (1)$$

wherein B is the magnetic field strength, $\mu_o$ is the magnetic permeability of free space and $\mu_r$ is the relative permeability of the material, respectively.

The electric density $w_e$ is found from Equation 2.

$$w_e = \tfrac{1}{2}\epsilon_0\epsilon_r E^2 \quad (2)$$

wherein E is the electric field strength, $\epsilon_o$ is the electrical permittivity of free space and $\epsilon_r$ is the relative permittivity of the material, respectively.

The ranges of the field strengths for the process are 1-10 tesla (10-100 kilooersteds or $10^4$-$10^5$ gauss) for the magnetic fields and 0.1-1 MV/cm for the electric fields.

From Equation (1), for a magnetic field of 10 tesla and a relative permeability of 100 (a typical value for magnetic materials), the magnetic energy density in the material will be 0.4 $J/cm^3$.

From Equation (2), for an electric field of 1 MV/cm and a relative permittivity of 300 (the value for strontium titanate, a representative material), the electric energy density in the material will be 13.2 $J/cm^3$.

These values can be compared to the potential energy associated with the magnetic moment of copper ions in the YBCO superconducting material described below. The magnetic moment of copper ions is $2.78 \times 10^{-24}$ $A\text{-}m^2$. Estimating that the number of copper ions in the superconducting material is $2.7 \times 10^{22}$ $ions/cm^3$, the potential energy associated with the magnetic moment of copper ions is 0.75 $J/cm^3$.

A similar comparison of these values can be made to the thermal energy from heat capacity considerations. Dulong and Petit's Law states that for metals, the thermal energy equals 3 RT, where 3 R = 25 J/mole-°K. and T is the temperature in °K. Applying this Law to the YBCO superconducting material for a temperature of 1200° K. yields a thermal energy density of 452 $J/cm^3$. However, not all of this energy will be used in the formation of the microcrystalline structure during formation of the material.

It can be considered that in the present invention the thermal energy densities predominate and are directed to formation of the ceramic structure while the magnetic and electric energy densities are applied to producing the desired magnetic alignment of the crystalline grains. The values derived above can be compared to those for the related Stark and Zeeman Effects, which are E=0.1 MV/cm and H=3 tesla respectively. Thus one can expect that the magnetic fields of 1-10 tesla and electric fields of 0.1-1 MV/cm will be quite effective in producing the desired orientation of the grain moments.

As noted, preferred for use in the process herein are the oxide ceramics, particularly the cuprates. These materials are of interest since in addition to the orientation of the grains as described above, these materials also are, in their crystalline form, deficient in elemental atoms (in the case of many cuprates, the element is oxygen). The application of a strong electric field during formation imposes a dipole moment across the oxygen-deficient crystalline lattice which causes the unit cell structure to expand and thus facilitates the controlled addition of oxygen into the structure so that the exact desired amount of oxygen can be incorporated into the crystalline structure and the maximum superconductivity obtained. Thus, while the process is applicable generally to crystalline materials which have an elemental deficiency as a factor in superconductivity properties, for clarity herein the process will be described in terms of the preferred cuprate ceramics.

Cuprate perovskites generally have the formula $R_wM_zX_y$, where R is a trivalent element, normally yttrium, lanthanum or a rare earth element, M is a divalent alkaline earth element, and X is a non-metallic component, generally a metal oxide. The concentrations signified by w, y and z vary according to the compounds involved, but generally are on the order of 1 or 2, and 3. The invention is particularly applicable to those perovskites known as the "1-2-3" perovskites, i.e., those with formulas of $RM_2Z_3O_x$, where R and M are as defined above, Z is a transition metal (normally copper) and x equals approximately 6-8. Among the best known of these compounds are $La_{1.85}Sr_{0.15}CuO_4$, $HoBa_2Cu_3O_x$, $GdBa_2Cu_3O_x$ and $YBa_2Cu_3O_{6.8}$ (the last compound will sometimes be referred to herein by the acronym "YBCO"). Also of interest are the "thallium/bismuth" cuprates, which have the formula $M_yM'_2Ca_{n-1}Cu_nO_z$, wherein M is thallium or bismuth, M' is barium or strontium, n=an integer of 1-4, y=1 or 2, and z is a variable dependent on n and y as described by Haldar et al., supra, with a value in the range of about 4-12. Other useful related materials are similar lattice structures such as tungsten-bronze.

Figure 3:
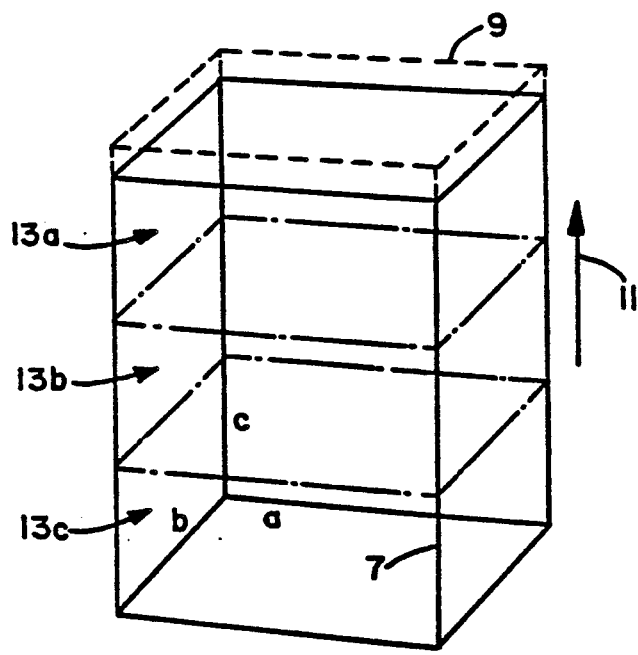
FIG. 3 is a schematic diagram showing the elongation of a crystalline lattice upon application of an electric field.

The elongation or stretching of the unit crystal lattice of the ceramic is illustrated schematically in FIG. 3. The normal unit cell dimensions are indicated by the solid lines, labeled a, b and c to distinguish the perpendicular axes. (The crystal structure shown is a tetragonal structure, as is the structure of many of the perovskites, but the concept shown in FIG. 3 is applicable to any unit cell structure.) Imposition of an electric field 11 parallel to the c axis causes the unit cell 7 to elongate in that direction as indicated by the dotted lines 9. The elongation is proportional along the c axis of the lattice. For instance, many cuprates exhibit a triple unit cell structure, as indicated by the regions 13a, 13b and 13c. Each of these will elongate in proportion to the whole unit cell, so that the incremental elongations for each region will sum to the total elongation indicated at 9. In contrast to this, a large magnetic field exerts a high pressure on the material and this magnetic pressure during formation can enhance superconducting properties.

Figure 4:
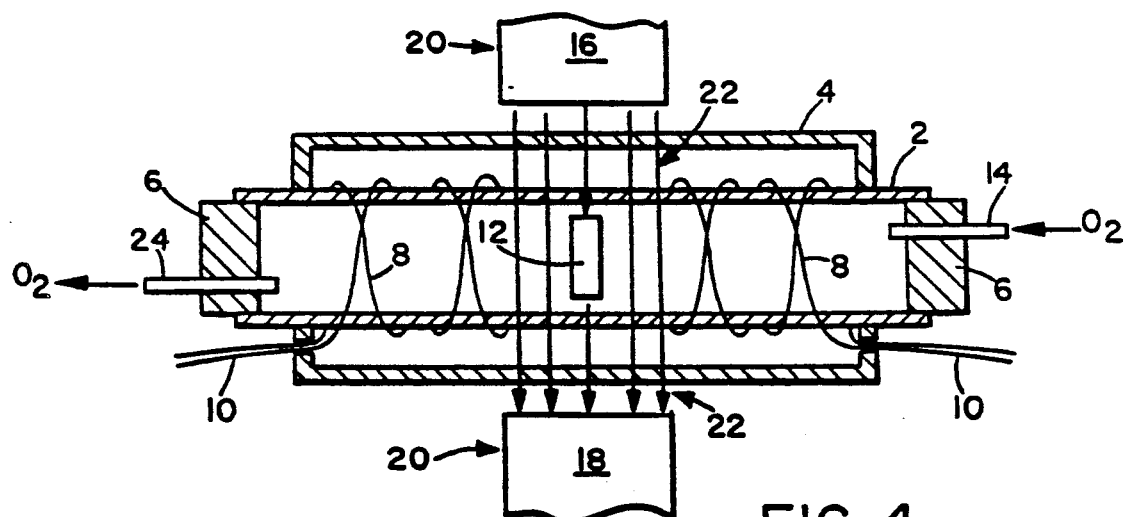
FIG. 4 is a schematic diagram, partially in section, of the formation of a superconducting crystalline material in a tube furnace under the influence of a strong magnetic field applied across the formation zone.

Considering the values derived above indicating the relative energy density fields, one can recognize different types of systems which will produce the desired effects and will permit formation of the oriented superconducting ceramics. One preferred system uses a tube furnace inside of which are placed the components to form the ceramic and across which is imposed a magnetic field by locating the formation zone in a tube furnace between the poles of a magnet capable of generating a 1-10 tesla field. Such an arrangement is illustrated schematically in FIG. 4. The furnace is formed of an interior quartz tube 2 which extends longitudinally through an outer cylinder of thermal insulation 4. The quartz tube 2 is capped at each end by additional insulation 6. Within the insulation the tube is wrapped with electric heating coils 8 which have leads 10 extending through insulation 4 to a source of electric power (not shown). The heating coils are of sufficient capacity to heat the reactants of the ceramic to a temperature above the sintering temperature.

Situated in the center of tube 2 is the formation region 12 with apparatus to retain the reactants of the ceramic. Typically the ceramic is formed by reacting stoichiometric quantities of appropriate oxides at a temperature at the sintering temperature of the ceramic, then annealing and cooling the ceramic. For instance, in the case of a YBCO superconducting ceramic, the reactants are barium carbonate ($BaCO_3$), yttria ($Y_2O_3$) and calcia (CaO), all of which are of extremely high purity (approximate 99.999% pure). The mixed oxides are placed in a suitable crucible and heated in the furnace at a temperature of up to 960° C. in air or oxygen. A typical heating cycle requires 10 hours to reach the operating temperature, maintenance at temperature for 72 hours and then cooling for 2 hours to 300° C. at which point the resulting sintered ceramic can be removed from the furnace. The degree of oxygen inclusion in the crystalline structure is controlled by providing an oxygen atmosphere as indicated at 14.

The 1-10 tesla magnetic field imposed across the formation zone 12 is generated by a large C-shaped magnet with the furnace being located between the opposite poles 16 and 18 of the unit 20. For very strong magnetic fields (e.g., about 10 tesla) a superconducting magnet with solenoidal geometry could be used. The magnetic field is schematically represented by flux lines 22. When the ceramic has an oxygen-deficient unit cell structure, oxygen is flowed through the furnace as the reaction progresses, exiting at 24. The flow rate of the oxygen and the capacity of the furnace will determine the degree of oxygen uptake through the crystalline structure.

The application of the magnetic field is continued throughout most or all of the temperature cycle, including the sintering step, the subsequent annealing and the final cooling. The annealing may if desired be conducted either under an oxygen atmosphere to further to refine the oxygen content of the ceramic or under an inert atmosphere to preserve the oxygen content developed during the sintering step.

It will be understood that, if a superconducting magnet is used, the thermal insulation 4 must be highly efficient because of the extreme temperature gradients involved (e.g., <15° K. at the magnet, >1200° K. in the forming zone).

Figure 5:
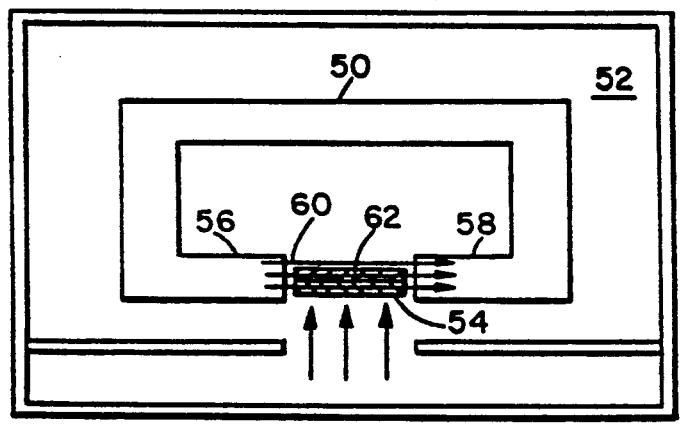
FIG. 5 is a similar schematic diagram showing a formation of a thin film superconducting material in a deposition chamber under the influence of a strong magnetic field.

Another embodiment of the present invention involves the formation of thin film superconducting oxides on a conventional substrate. This is illustrated schematically in FIG. 5. A large C-shaped magnet 50 is placed inside an enclosed chamber 52 with a substrate 54 placed between the poles 56 and 58 of the magnet 50. A magnetic field indicated by flux lines 60 is imposed across the gap between the poles and the reactants to be deposited are introduced into the chamber 52. The actual vapor deposition can be by any of several known techniques. Typical processes which can be used include chemical vapor deposition with reaction in the vapor phase or reaction at the catalytic surface of the substrate 54, both of which will form the deposited layer 62. An alternative procedure for formation of the layer 62 is by sputtering from a source of the crystalline material. The temperature inside chamber 52 will be determined by the need of the process for deposition of the film, although one must be careful to have the temperature remain below the Curie temperature of the material of which magnet 50 is formed, since magnet 50 is enclosed within chamber 52. This can be done by thermally shielding the magnet.

The field imposed can also be an electric field of 0.1-1 MV/cm strength. It is anticipated that the lower portion of this range will be easier to maintain than the upper portion of the range, although it is preferred to have the value be at as high a level as possible within this range. Application will be in the same manner as illustrated in FIGS. 1 and 2, except that of course the electric field will be applied with the electric field generating analog of magnet 50, as described below.

Figure 6:
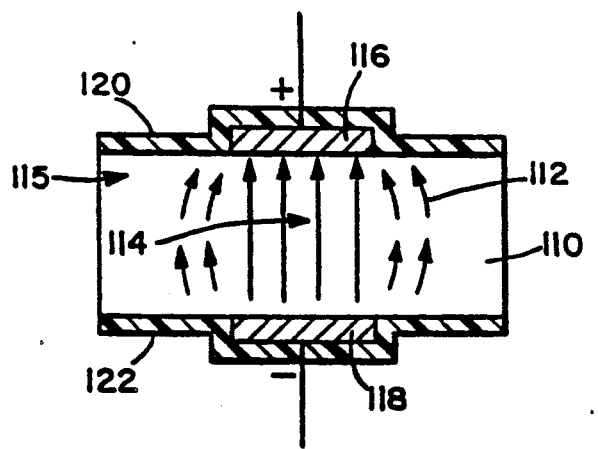
FIG. 6 is a schematic diagram of a device for production of very strong electric fields.

There are a number of commercial devices available which will produce a field of 0.1 MV/cm, and the stronger fields up to 1.0 MV/cm may be obtained by modification of the commercial devices. For moderate electric fields, the reactants, in powdered form, can be placed between two electrodes in a parallel plate geometry. In air breakdown occurs for electric fields of 0.03 MV/cm, so that the apparatus should be operated in an environment of nitrogen at a pressure of at least five atmospheres, thus permitting electric fields of at least 0.1 MV/cm to be achieved. For higher fields, up to 1.0 MV/cm, the reactants can extend past the electrodes to minimize voltage flashover and the whole electrode surfaces can be encapsulated in an insulating layer, such as spun glass coatings. This is illustrated in FIG. 6, showing parallel plate geometry, The reactants 110 are confined between parallel high voltage electrodes 116 and 118 and, as noted above, extend beyond the ends of the electrodes to minimize flashover. The electric field generated by the electrodes is indicated by the arrows 112. The electrodes are covered by spun glass coatings 120 and 122, which extend beyond the edges of the electrodes to cover the extended portions of the reactants 110 and the entire apparatus is maintained in a pressurized nitrogen atmosphere. As the formation of the material from the reactants takes place, all portions of the final product will have superconducting properties, but the portion 114 which lies within the applied field will have superconducting properties which are field-enhanced with respect to the properties of the portion 115 to which the field has not been applied.

(It has here been assumed that the material sample is highly insulating with a high voltage breakdown, as is the case when the material is oxygen deficient. Thus when using very high fields one synthesizes the microstructure as an insulator and then later when the field is removed introduces oxygen into the structure.)

It is also quite possible to apply a magnetic field and an electric field across the crystal formation zone 12 simultaneously.

It will be evident that there are numerous embodiments of the present invention which, while not expressly described above, are clearly within the scope and spirit of the invention. The above description is therefore to be considered only exemplary, and the scope of the invention is to be limited solely by the appended claims.

I claim:

1. A process for the formation or enhancement of superconducting properties in a superconductivity-susceptible material which comprises:
   a. reacting reactants which produce said material in a formation zone during a temperature cycle including a temperature of at least the sintering temperature of said reactants to form said material; and
   b. imposing across said formation zone substantially throughout the temperature cycle of formation of said material a continuous magnetic field of 1 to 10 tesla to form or enhance superconducting properties in said material.

2. A process as in claim 1 wherein said imposition of said magnetic field causes at least partial alignment of the magnetic moments of the grains in said material.

3. A process as in claim 1 wherein said material is in bulk form.

4. A process as in claim 1 wherein said material is in the form of a thin film.

5. A process for the formation or enhancement of superconducting properties by inducing grain orientation in a crystalline material, which comprises:
   a. reacting reactants which produce said crystalline material in a formation zone during a temperature cycle including a temperature of at least the sintering temperature of said reactants to form said crystalline material; and
   b. imposing across said formation zone substantially throughout the temperature cycle of formation of said crystalline material a continuous magnetic field of 1 to 10 tesla to induce at least partial orientation of the grains in said crystalline material and to form or enhance superconducting properties in said crystalline material.

6. A process for the formation or enhancement of superconducting properties by inducing grain orientation in an oxide crystalline material, which comprises:
   a. reacting reactants which produce said oxide crystalline material in a formation zone during a temperature cycle including a temperature of at least the sintering temperature of said reactants to form said oxide crystalline material; and
   b. imposing across said formation zone substantially throughout the temperature cycle of formation of said oxide crystalline material a continuous magnetic field of 1 to 10 tesla to induce at least partial orientation of the grains in said oxide crystalline material and to form or enhance superconducting properties in said oxide crystalline material.

7. A process as in claim 6 wherein said oxide crystalline material is a cuprate.

8. A process as in claim 7 wherein said cuprate is a perovskite of the formula $RM_2Z_3O_x$, wherein R is yttrium, lanthanum or a rare earth element, M is an alkaline earth element, Z is a transition metal element and x equals approximately 6-8.

9. A process as in claim 8 wherein said perovskite is a "1-2-3" perovskite of the formula $RBa_2Cu_3O_x$.

10. A process as in claim 9 wherein R is yttrium.

11. A process as in claim 7 wherein said cuprate has the formula $M_yM'_2Ca_{n-1}Cu_nO_z$, wherein M is thallium or bismuth, M' is barium or strontium, n=an integer of 1-4, y=1 or 2, and z is a variable dependent on n and y with a value in the range of about 4-12.

12. A process for the formation of superconducting properties in an oxide crystalline material which comprises:
   a. reacting reactants which produce said oxide crystalline material in a formation zone during a temperature cycle including a temperature of at least the sintering temperature of said reactants to form said oxide crystalline material having at least one elemental deficiency per crystal unit;
   b. conducting said reaction in the presence of a gas which supplies a desired quantity of the missing element to the crystalline material; and
   c. imposing across said formation zone substantially throughout the temperature cycle of formation of said oxide crystalline material a continuous magnetic field of 1 to 10 tesla to induce at least partial orientation of the grains in said oxide crystalline material and to form or enhance superconducting properties in said oxide crystalline material.

13. A process as in claim 12 wherein said oxide crystalline material is a cuprate.

14. A process as in claim 13 wherein said cuprate is a perovskite of the formula $RM_2Z_3O_x$, wherein R is yttrium, lanthanum or a rare earth element, M is an alkaline earth element, Z is a transition metal element and x equals approximately 6-8.

15. A process as in claim 14 wherein said perovskite is a "1-2-3" perovskite of the formula $RBa_2Cu_3O_x$.

16. A process as in claim 14 wherein R is yttrium.

17. A process as in claim 13 wherein said cuprate has the formula $M_yM'_2Ca_{n-1}Cu_nO_z$, wherein M is thallium or bismuth, M' is barium or strontium, n=an integer of 1-4, y=1 or 2, and z is a variable dependent on n and y with a value in the range of about 4-12.

* * * * *

UNITED STATES PATENT AND TRADEMARK OFFICE
CERTIFICATE OF CORRECTION

PATENT NO. : 5,096,880
DATED : March 17, 1992
INVENTOR(S) : Theodore W. Rybka It is certified that error appears in the above-identified patent and that said Letters Patent is hereby corrected as shown below:

Title Page: Item [54] "METHOD AND APPARATUS FOR INDUCING GRAIN ORIENTATION BY MAGNETIC AND ELECTRIC FIELD ORDERING DURING BULK SUPERCONDUCTING SYNTHESIS" should read --METHOD AND APPARATUS FOR INDUCING GRAIN ORIENTATION BY MAGNETIC FIELD ORDERING DURING BULK SUPERCONDUCTING SYNTHESIS--.

Signed and Sealed this

Twenty-second Day of June, 1993

Attest:

MICHAEL K. KIRK

*Attesting Officer*   *Acting Commissioner of Patents and Trademarks*